(12) United States Patent
Chang

(10) Patent No.: US 8,633,057 B2
(45) Date of Patent: Jan. 21, 2014

(54) SEMICONDUCTOR PACKAGE AND METHOD OF FABRICATING THE SAME

(71) Applicant: Electronics and Telecommunications Research Institute, Daejeon (KR)

(72) Inventor: Woojin Chang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/875,795

(22) Filed: May 2, 2013

(65) Prior Publication Data

US 2013/0244379 A1     Sep. 19, 2013

Related U.S. Application Data

(62) Division of application No. 13/013,912, filed on Jan. 26, 2011, now Pat. No. 8,455,992.

(30) Foreign Application Priority Data

Oct. 12, 2010   (KR) .................. 10-2010-0099315

(51) Int. Cl.
  *H01L 21/50*   (2006.01)
(52) U.S. Cl.
  USPC ............ 438/107; 257/E21.499; 257/E21.502; 438/106; 438/109; 438/118; 438/125; 438/126; 438/127

(58) Field of Classification Search
  USPC ........... 257/E21.499, E21.502; 438/106, 107, 438/109, 118, 125, 126, 127
  See application file for complete search history.

(56) References Cited

U.S. PATENT DOCUMENTS

| | | | |
|---|---|---|---|
| 5,353,498 A | 10/1994 | Fillion et al. | |
| 6,861,737 B1 | 3/2005 | Jeong et al. | |
| 7,696,616 B2 * | 4/2010 | Shinma et al. | 257/686 |
| 2004/0084211 A1 | 5/2004 | Fayfield | |
| 2006/0055039 A1 * | 3/2006 | Eide | 257/738 |
| 2006/0267173 A1 | 11/2006 | Takiar et al. | |
| 2007/0117338 A1 * | 5/2007 | Yamamoto et al. | 438/396 |
| 2010/0078812 A1 * | 4/2010 | Chen | 257/738 |

FOREIGN PATENT DOCUMENTS

| | | |
|---|---|---|
| JP | 2007-266139 A | 10/2007 |
| KR | 2004-0107442 A | 12/2004 |
| KR | 2008-0013937 A | 2/2008 |
| KR | 10-0895815 | 4/2009 |
| KR | 2009-0034081 A | 4/2009 |

* cited by examiner

*Primary Examiner* — Peniel M Gumedzoe

(74) *Attorney, Agent, or Firm* — Rabin & Berdo, P.C.

(57) ABSTRACT

Provided is a semiconductor package and a method of fabricating the same. The semiconductor package includes: a package body including a plurality of sheets; semiconductor chips mounted in the package body; and an external connection terminal provided on a first side of the package body, wherein the sheets are stacked in a parallel direction to the first side.

12 Claims, 7 Drawing Sheets

SEMICONDUCTOR PACKAGE AND METHOD OF FABRICATING THE SAME

CROSS-REFERENCE TO RELATED APPLICATIONS

This is a divisional of co-pending U.S. application Ser. No. 13/013,912, filed Jan. 26, 2011. This U.S. non-provisional patent application claims priority under 35 U.S.C. §119 of Korean Patent Application No. 10-2010-0099315, filed on Oct. 12, 2010, the entire contents of which are hereby incorporated by reference.

BACKGROUND

The present invention disclosed herein relates to a semiconductor package, and more particularly, to a semiconductor package using a Low Temperature Cofired Ceramic (LTCC) technique and a method of fabricating the same.

Techniques required for realizing current electronic products are related to miniaturization and high performance. In order to achieve the miniaturization and high performance, a demand on a three-dimensional stack technique is increased to manufacture a variety of integrated circuits and passive devices in one module by applying a system in package process.

The LTCC technique realizes a given circuit by printing an inner device and a passive device on a plurality of green sheet layers consisting of glass-ceramic materials mainly and then manufactures a multi chip module after each layer is stacked and cofired.

The LTCC technique may realize a circuit substrate and a complex module having high performance and high reliability. The LTCC technique was expected to be developed and supplied for diverse purposes at the originally developed time but was limitedly used in fields such as super computer or aerospace, which require special reliability. As a result, its market does not expand as has been expected because of an existing resin multi-layer substrate. However, as a mobile communication market expands drastically in recent years, the LTCC is utilized to achieve miniaturization, low manufacturing cost, and high performance of a high frequency analog circuit.

Although a typical ceramic multi-layer substrate formed of alumina as a main element requires a high firing temperature, the LTCC technique makes a low temperature firing possible by adding a glass based material. Because of this low temperature firing, it allows high electrical conductive metal of low price and a low melting point to be used as a material for inner layer wiring. Additionally, the LTCC technique suppresses contraction of a green sheet in directions of x-axis and y-axis so that it is possible to realize an initially designed circuit as it is.

Additionally, the LTCC technique is used for products such as a power amplifier module, an engine control unit (ECU) for car, a band pass filter, a micro antenna, and a wireless interface such as a mobile phone so that products of high frequency, high reliability, low price, miniaturization, and low power consumption may be realized.

SUMMARY

The present invention provides a structure capable of mounting a plurality of chips through an LTCC technique.

The present invention also provides a semiconductor package having the improved degree of integration through an LTCC technique.

Embodiments of the present invention provide semiconductor package including: a package body including a plurality of sheets; semiconductor chips mounted in the package body; and an external connection terminal provided on a first side of the package body, wherein the sheets are stacked in a parallel direction to the first side.

In some embodiments, the sheets may have a surface vertical to the first side; and the semiconductor chips may have a surface vertical to the first side.

In other embodiments, the semiconductor chips may be attached on the sheets through a bump provided at one side of the semiconductor chips.

In still other embodiments, the other side facing the one side of the semiconductor chip with the bump may be spaced apart from the sheets.

In even other embodiments, the semiconductor packages may further include a buffer member between the semiconductor chips and the sheets.

In yet other embodiments, the sheets may include vias penetrating at least a portion of the sheets and conductive patterns connected to the vias electrically; and the semiconductor chips may be electrically connected to the external connection terminal through the vias and the conductive patterns.

In further embodiments, the semiconductor chips may be mutually connected through the vias and the conductive patterns.

In still further embodiments, at least a portion of the sheets may include a chip receiving region that receives the semiconductor chip.

In even further embodiments, the semiconductor packages may further include an adhesive layer between the sheets.

In other embodiments of the present invention, methods of fabricating a semiconductor package include: forming a plurality of sheets where a conductive pattern and a via are formed; attaching semiconductor chips to at least a portion of the sheets; forming a package body by stacking the plurality of sheets in a first direction; and forming an external connection terminal on a first side of the package body, wherein the first side is parallel to the first direction.

In some embodiments, the forming of the sheets may include forming a chip mounting region for mounting the semiconductor chips on the sheets.

In other embodiments, the forming of the chip mounting region may include recessing the sheets through laser processing or punching.

In still other embodiments, the forming of the package body may further include forming an adhesive layer between the sheets.

In even other embodiments, the forming of the package body may further include performing a firing process on the sheets before the forming of the adhesive layer.

In yet other embodiments, the methods may further include performing a firing process after the stacking of the sheets.

In further embodiments, the first side exposes the conductive patterns and the conductive patterns may be electrically connected to the external connection terminal.

In still further embodiments, the methods may further include, before the forming of the external connection terminal, forming a connection member by performing a plating process on the exposed conductive patterns.

In even further embodiments, the methods may further include, before the forming of the external connection terminal, exposing the conductive patterns by performing a grinding process on the first side.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
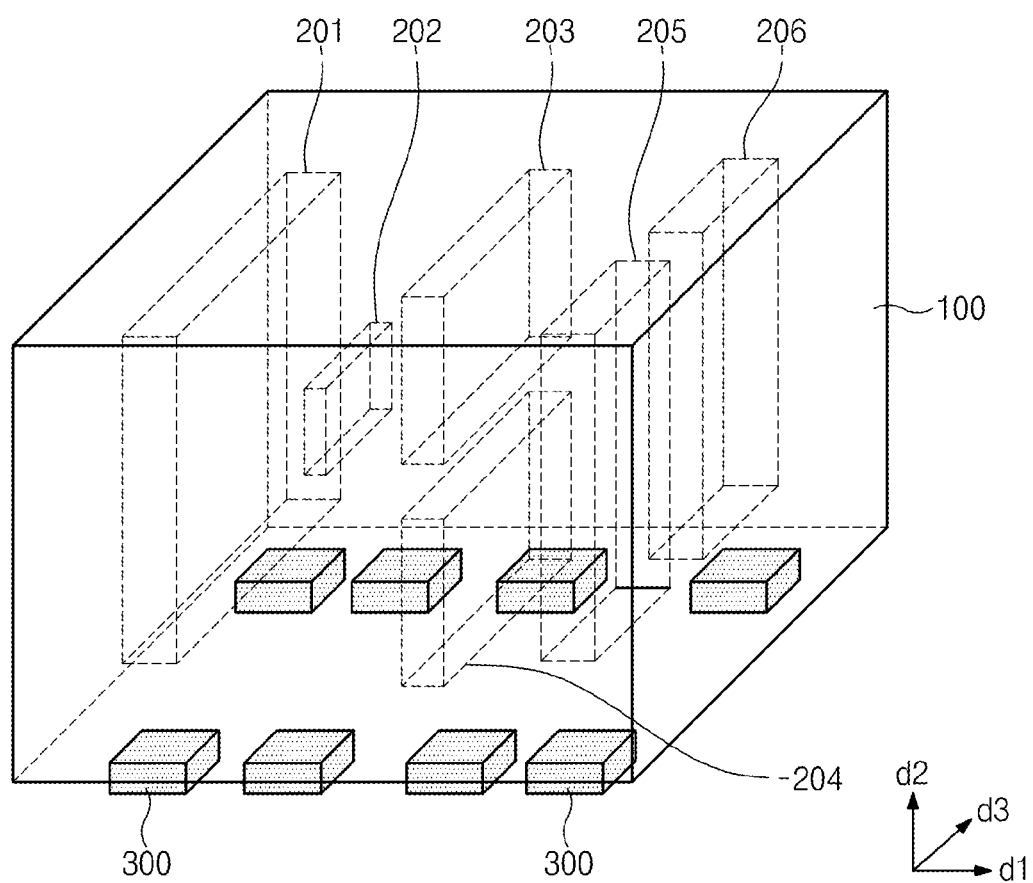
FIGS. 1 and 2 are perspective view and a sectional view respectively illustrating a semiconductor package according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

"Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present invention.

Figure 2:
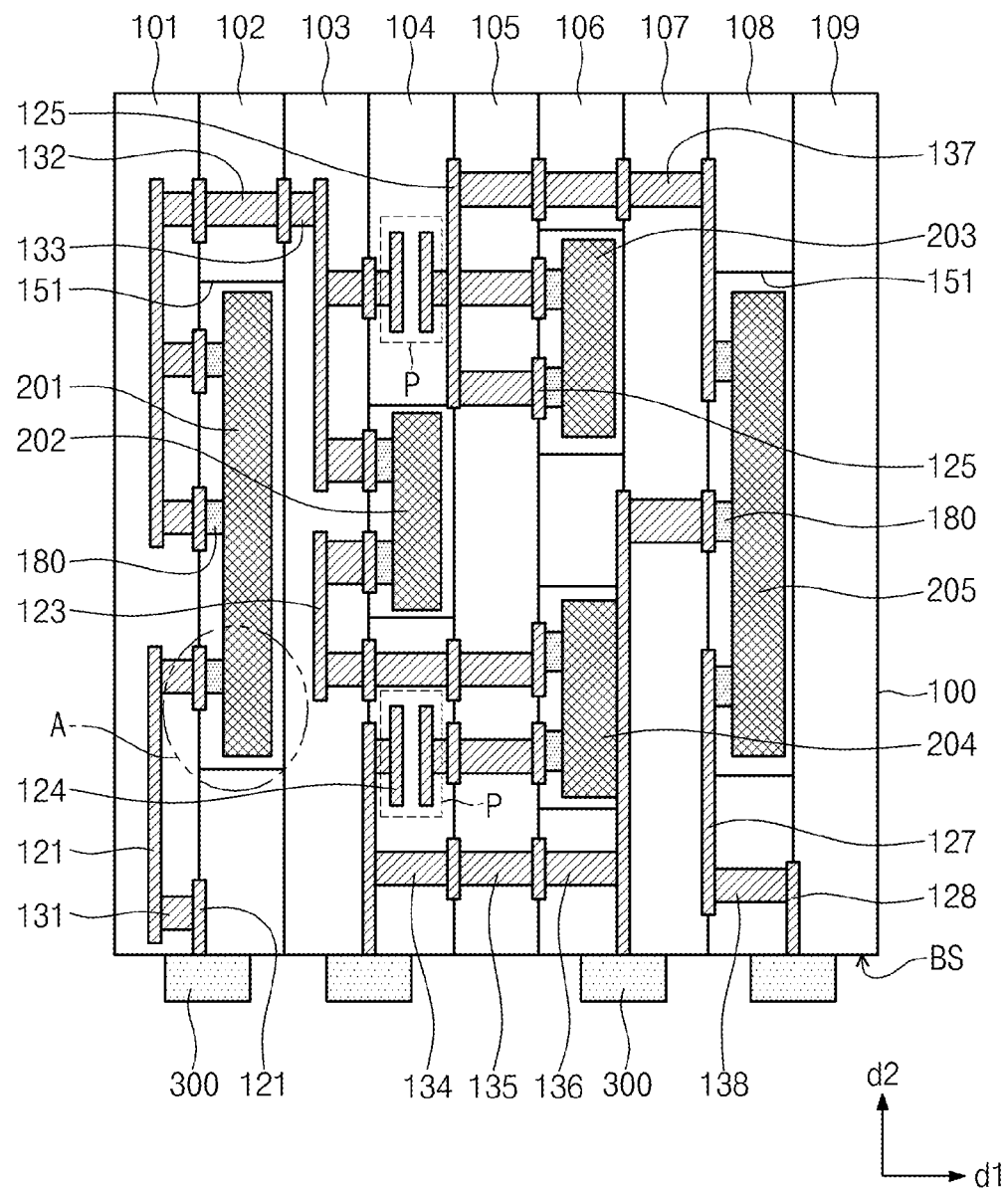
Figure 3:
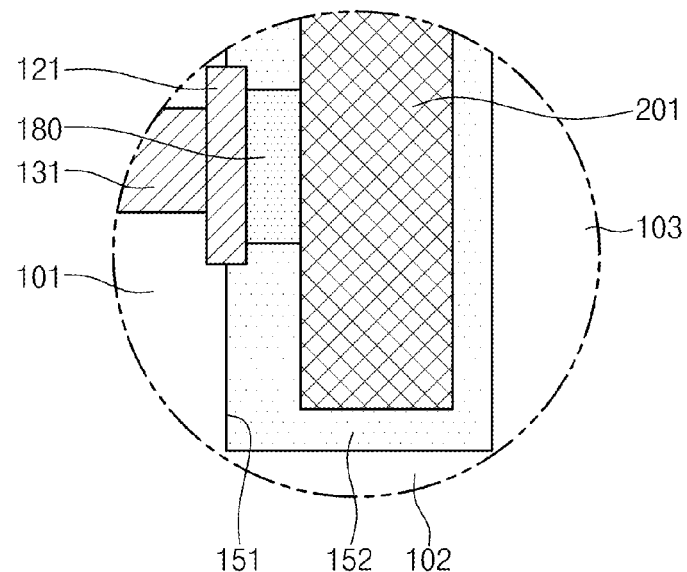
FIGS. 3 and 4 are sectional views illustrating a modified embodiment of a region A of FIG. 2.
Figure 4:
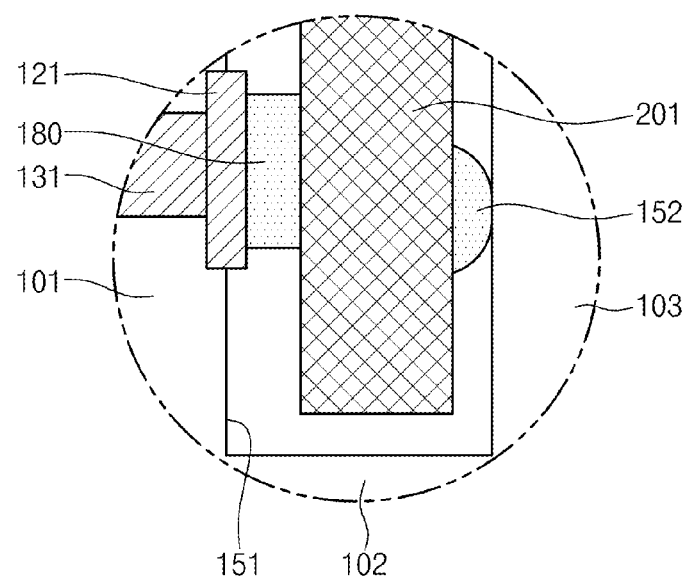

FIGS. 1 through 4 are views illustrating a semiconductor package according to an embodiment of the present invention. FIG. 2 is a sectional view of FIG. 1. FIGS. 3 and 4 are sectional views illustrating a modified embodiment of a region A of FIG. 2.

Referring to FIGS. 1 through 4, a package body 100 including stacked first to ninth sheets 101 to 109 is provided. The sheets 101 to 109 may be a Low Temperature Co-Fired Ceramic (LTCC) green-sheet. As one example, the sheets 101 to 109 may include a glass-based material on which low temperature firing is possible. The green-sheet may be advantageous to mounting a semiconductor chip because its coefficient of thermal expansion is similar to silicon. Also, the green-sheet may easily discharge heat generated from a semiconductor chip because of its high thermal conductivity. The number and form of the sheets 101 to 109 are not limited to the drawings. The sheets 101 to 109 may be formed of the same material. Unlike this, the sheets 101 to 109 may be formed of mutually different materials. As one example, some of the sheets 101 to 109 are formed of a material having a higher hardness than other sheets so that they support the package body 100. The ninth sheet 109 is a layer for protecting a semiconductor chip described below and may not be provided, if necessary.

An external connection terminal 300 may be provided to the first side BS of the package body 100. The external connection terminal 300 may provide an electrical connection with external devices. As one example, the external connection terminal 300 may be a solder bump. The external connection terminal 300 may include terminals disposed in two columns as shown in FIG. 1 but the present invention is not limited thereto. Also, various modifications for electrical connections may be possible.

The sheets 101 to 109 may have a structure in which they are stacked along a first direction d1. The first direction d1 may be substantially parallel to the first side BS of the package body 100 to which the external connection terminal 300 is attached. The first side BS may consist of the sidewalls of the stacked sheets 101 to 109. The sheets 101 to 109 may be substantially vertical to the first side BS. The first side BS may be a plane that is substantially parallel to the surface of an external substrate (not shown) on which the package body 100 is mounted. That is, the sheets 101 to 109 may be vertical to the surface of the external substrate on which the package body 100 is mounted.

First to eighth conductive patterns 121 to 128 and first to eighth vias 131 to 138 may be provided on the sheets 101 to 109. Hereinafter, in relation to the specification, the first conductive pattern 121 may refer to a conductive pattern on the first sheet 101 and the first via 131 may refer to a via in the first sheet 101. The conductive patterns 121 to 128 may be provided on the surface or the inside of the sheets 101 to 109. The conductive patterns 121 to 128 may be formed of a conductive material including at least one of Au, Ag, and Cu. The vias 131 to 138 may fill a via hole penetrating at least a portion of the sheets 101 to 109. The vias 131 to 138 may be formed of a conductive material including at least one of Au, Ag, and Cu. The conductive patterns 121 to 128 and the vias 131 to 138 may electrically connect semiconductor chips described below with the external connection terminal 300. Forms of the conductive patterns 121 to 128 and the vias 131 to 138 are just one example and thus various forms are possible.

The conductive patterns 121 to 128 and the vias 131 to 138 may constitute a passive device in the package body 100. The passive device may be a capacitor, a resistor, and an inductor. As one example, the passive device may be a capacitor as being formed in a region P of FIG. 2.

A plurality of semiconductor chips 201 to 206 may be mounted in the package body 100. The semiconductor chips 201 to 206 may be provided in chip mounting regions 151 formed in the sheets 102, 104, 106, and 108. At least one of the plurality of semiconductor chips 201 to 206 may have a different size or function. Accordingly, chips for various functions may be mounted in one package. The semiconductor chips 201 to 206 may be substantially vertical to the first side BS having the external connection terminal 300. That is, the semiconductor chips 201 to 206 may extend in a second direction d2 vertical to the first direction d1. The semiconductor chips 201 to 206 may be substantially vertical to the surface of an external substrate (not shown) on which a semiconductor package is mounted. The semiconductor chips 201 to 206 may be electrically connected to the conductive patterns 121 to 128 through bumps 180.

A plurality of semiconductor chips may be mounted on one sheet. As one example, a third semiconductor chip 203 and a fourth semiconductor chip 204 may be mounted on the chip mounting regions 151 formed in the sixth sheet 106. The third semiconductor chip 203 and the fourth semiconductor chip 204 may be arranged along a second direction d2. A fifth semiconductor chip 205 and a sixth semiconductor chip 206 may be mounted on the chip mounting regions 151 formed in the eighth sheet 108. The fifth semiconductor chip 205 and the sixth semiconductor chip 206 may be arranged along a third direction d3 vertical to the first direction d1 and the second direction d2. That is, according to an embodiment of the present invention, a plurality of semiconductor chips may be disposed on the same plane vertical to the first side BS.

The semiconductor chips 201 to 206 may be electrically connected to the external connection terminal 300 through the conductive patterns 121 to 128 and the vias 131 to 138. The semiconductor chips 201 to 206 may be mutually and electrically connected through the conductive patterns 121 to 128 and the vias 131 to 138. Forms of the conductive patterns 121 to 128 and the vias 131 to 138 are just one example and various forms for the electrical connections are possible.

The chip mounting regions 151 may be an empty space. Unlike this, the chip mounting regions 151 may be filled with a buffer member 152 as shown in FIG. 3. As one example, the buffer member 152 may be an epoxy resin. According another embodiment, the buffer member 152, as shown in FIG. 4, may be limitedly provided on the semiconductor chips 201 to 206. As one example, the buffer member 152 may be a semispherical structure formed on the top surface of the semiconductor chips 201 to 206. The buffer member 152 fills a separated space between the vertically mounted semiconductor chips 201 to 206 and the sheets 101 to 109 so as to prevent the semiconductor chips 201 to 206 from electrically being separated from the conductive patterns 121 to 128 due to a shock.

According to an embodiment of the present invention, an electrical connection in the package body 100 is possible without a bonding wire through wirings of the vias 131 to 138 and the conductive patterns 121 to 128. Accordingly, characteristic deterioration of a semiconductor chip due to a parasite component may be prevented. Additionally, semiconductor chips of mutually different sizes may be mounted in the package body 100. Moreover, if there is a semiconductor chip emitting a large amount of heat or a semiconductor chip causing signal interference, it may be positioned separately.

When the same semiconductor chips are stacked, they need to be electrically connected through a bonding wire or a conductive pillar but according to an embodiment of the present invention, since forms of the vias 131 to 138 and the conductive patterns 121 to 128 in the sheets 101 to 109 may be modified, they are not limited to sizes and forms of semiconductor chips and forms of a pad. Accordingly, while a semiconductor chip is designed, the positions and number of pads of a semiconductor chip may be selected without limitations. That is, semiconductor chips of respectively different sizes and functions may be packaged together more easily. Additionally, unnecessary routing for disposing a pad of a semiconductor chip at the outermost is removed so that a size of the semiconductor chip may be reduced.

According to an embodiment of the present invention, a plurality of semiconductor chips may be disposed on the same plane vertical to the surface of an external substrate on which a semiconductor package is mounted. Accordingly, a mounting region of a semiconductor package may be reduced further. Additionally, the sheets 101 to 109 and the semiconductor chips 201 to 206 may be substantially vertical to the external substrate to which the package body 100 is attached. This vertical structure may reduce an area that the package body 100 occupies while being mounted on the external substrate. Accordingly, the degree of integration in a semiconductor package may be improved and limitations of package height may be overcome.

Figure 5:
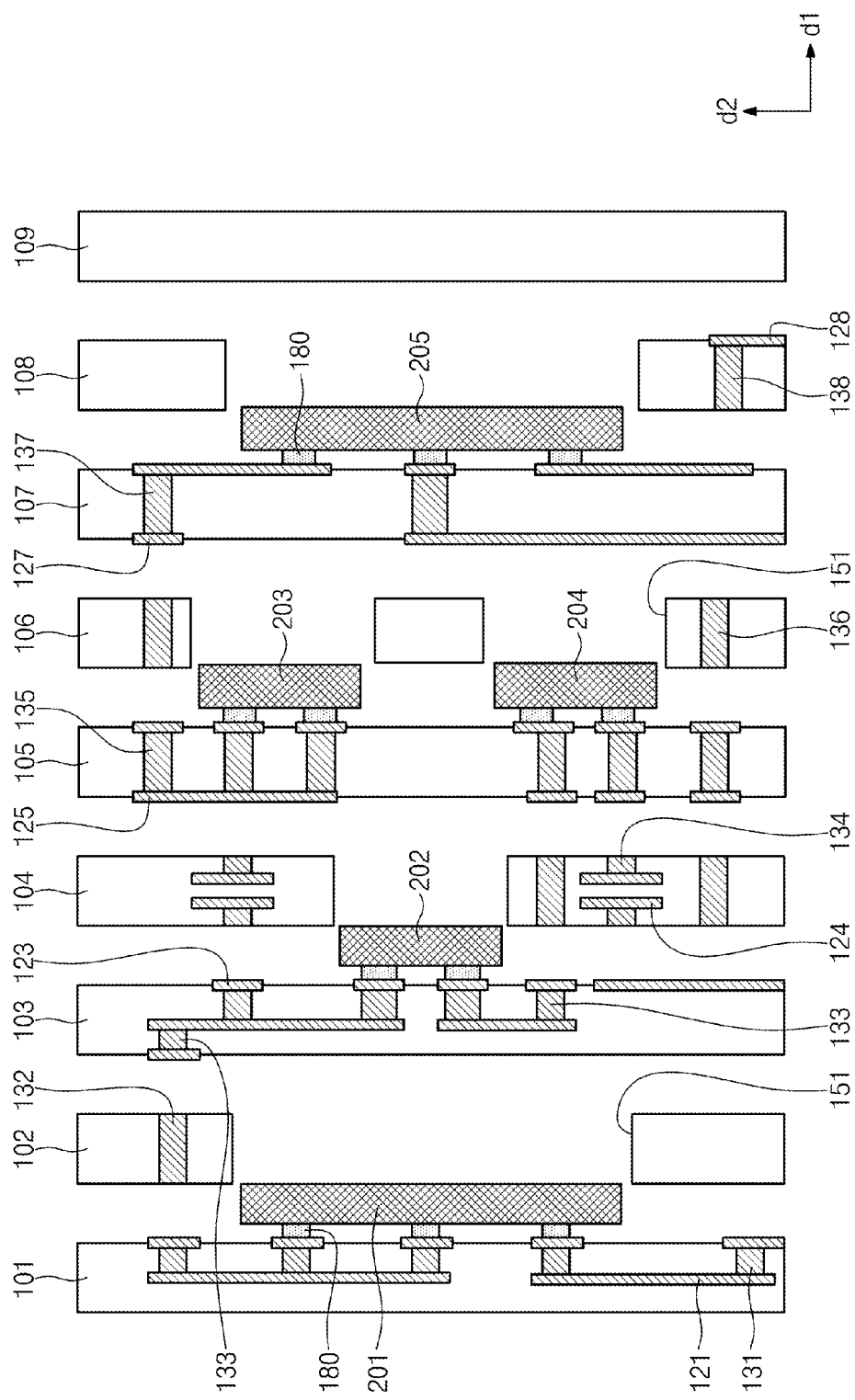
FIGS. 5 and 6 are views illustrating a method of fabricating a semiconductor package according to an embodiment of the present invention.
Figure 6:
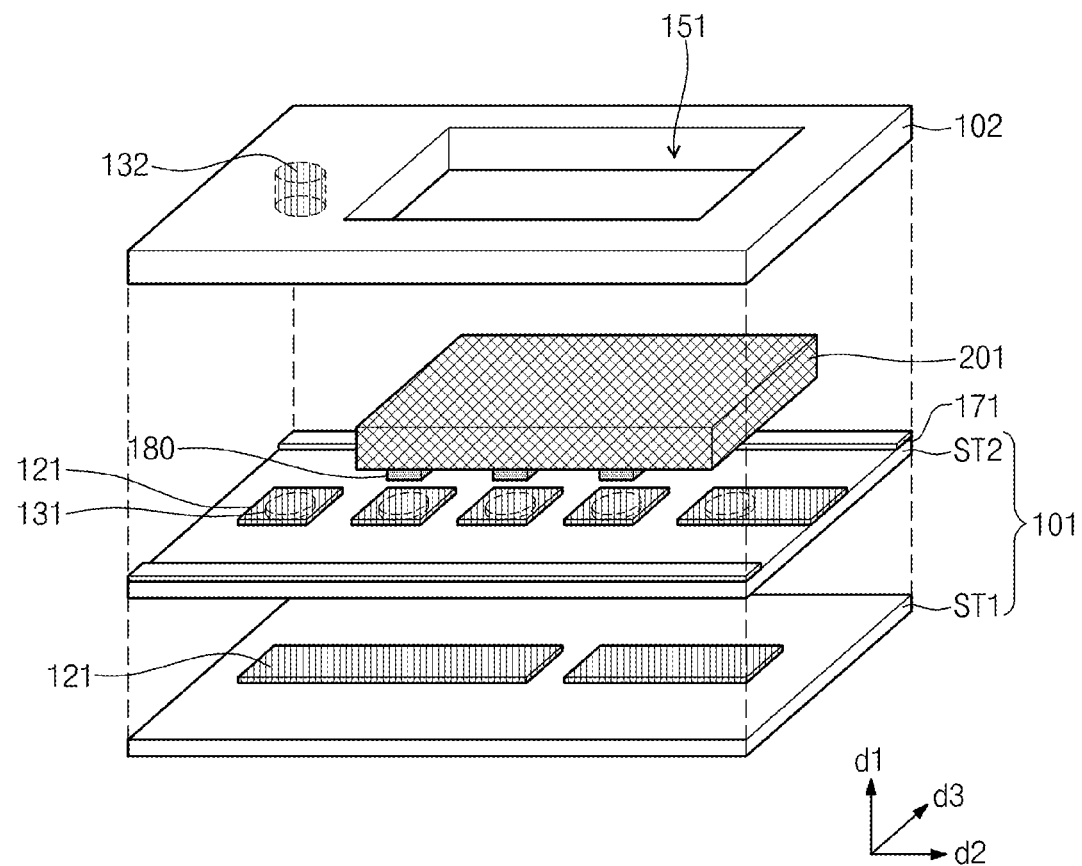

FIGS. 5 and 6 are views illustrating a method of fabricating a semiconductor package according to an embodiment of the present invention. FIG. 6 is a view illustrating a method of bonding a first sheet 101 and a second sheet 102 of FIG. 5.

Referring to FIG. 5, a plurality of sheets 101 to 109 are provided. The sheets 101 to 109 may be an LTCC green-sheet. The green-sheet may be formed of a material mixed with a predetermined ratio of a ceramic powder, a dispersant, a solvent, a polymer binder, a plasticizer, and other additives, if necessary. The sheet 101 to 109 may be a single sheet or, as shown in FIG. 6, the plurality of sub sheets ST1 and ST2 may be stacked.

First to eighth vias 131 to 138 and first to eighth conductive patterns 121 to 128 may be formed in the sheets 101 to 109. The first via 131 may refer to a via formed in the first sheet 101 and the first conductive pattern 121 may refer to a conductive pattern formed on the first sheet 101. The conductive patterns 121 to 128 may be formed on the surface of the sheets 101 to 109 or may be formed in the sheets 101 to 109. As one example, as shown in FIG. 6, after the first conductive pattern 121 is formed on the surface of each of sub sheets ST1 and ST2, the sub sheets ST1 and ST2 may be combined through a firing process. The conductive patterns 121 to 128 may include a conductive material of at least one selected from Au, Ag, and Cu. The conductive patterns 121 to 128 may be formed through a screen printing process or an inkjet printing process.

The vias 131 to 138 may penetrate at least a portion of the sheets 101 to 109. The vias 131 to 138 may be formed by filling via holes (not shown), formed through punching or laser processing of each sheet, with a conductive paste.

The vias 131 to 138 and the conductive patterns 121 to 128 may constitute a passive device. The passive device may include at least one of a capacitor, an inductor, or a resistor. As one example, the fourth via 134 and the fourth conductive pattern 124 may constitute a capacitor in the fourth sheet 104.

Chip mounting regions 151 may be formed on some 102, 104, 106, and 108 of the sheets. The chip mounting regions 151 may be formed through punching or laser processing of the sheets 102, 104, 106, and 108. As one example, the chip mounting regions 151 may be an empty space penetrating the sheets 102, 104, 106, and 108 completely. Unlike this, the chip mounting regions 151 may be a region that does not completely penetrate the sheets 102, 104, 106, and 108 and is recessed in a one direction. The forms and sizes of the chip mounting regions 151 may vary according to the forms and sizes of mounted semiconductor chips and an arrangement of a terminal.

A firing process may be performed on the sheets 101 to 109. The firing process may be performed at a low temperature of less than about 1000° C. As one example, the firing process may be performed before the stacking of each of the sheets 101 to 109. That is, a firing process may be performed while the sheets 101 to 109 are mutually separated. The firing process may be performed before semiconductor chips are attached.

The semiconductor chips 201 to 206 may be attached to the sheets 101, 103, 105, and 107. The semiconductor chips 201 to 206 may be attached on the conductive patterns 121 to 128 through a bump 180. As one example, the first semiconductor chip 201 may be attached on the first conductive pattern 121 formed on the first sheet 101. A plurality of semiconductor chips may be attached on one sheet. As one example, the third semiconductor chip 203 and the fourth semiconductor chip 204 may be attached on the fifth sheet 105. At least one of the semiconductor chips 201 to 206 may have a different size or function. Accordingly, chips for various functions may be mounted in one package.

After the attaching of the semiconductor chips 201 to 206, the sheets 101 to 109 are stacked and mutually attached. As one example, as shown in FIG. 6, an adhesive layer 171 may be provided to attach each of the sheets 101 to 109. The adhesive layer 171 may be a nonconductive adhesive tape including an epoxy resin or a solder paste.

During the stacking of the sheets 101 to 109, the buffer member 152 described with reference to FIGS. 3 and 4 may be formed on the chip mounting regions 151. The buffer member 152 fills at least a portion of the chip mounting regions 151 so that it prevents a short circuit of the semiconductor chips 201 to 206 when an impact is applied to a semiconductor package. The buffer member 152 may be an epoxy resin.

Unlike the aforesaid, the firing process may be performed after the semiconductor chips 201 to 206 are attached on the sheets 101 to 109 and the sheets 101 to 109 are stacked. In this case, the bonding of the sheets 101 to 109 is possible without the adhesive layer 171.

FIGS. 7 through 10 are views illustrating a modified embodiment of a method of fabricating a semiconductor package according to another embodiment of the present invention. For conciseness, the same component may not be described.

Figure 7:
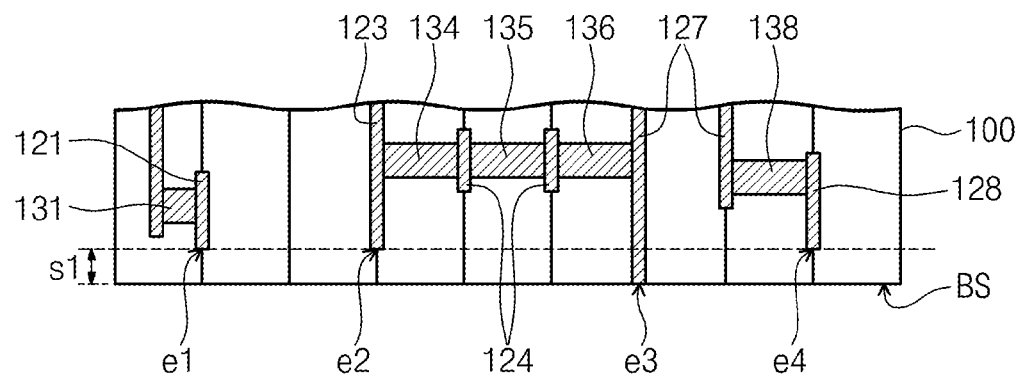
FIGS. 7 through 10 are views illustrating a method of fabricating a semiconductor package according to another embodiment of the present invention.

Referring to FIG. 7, a package body 100 having the stacked sheets 101 to 109 is provided. The first side BS of the package body 100 refers to a side to which an external connection terminal is attached. The first side BS may expose a third conductive line end part e3. Unlike this, the first side BS may not expose a first conductive line end part e1, a second conductive line end part e2, and a fourth conductive line end part e4. That is, the conductive line end parts e2, e2, and e4 may be spaced a predetermined distance s1 apart from the first side BS.

When some of the conductive line end parts e1 to e4 are not exposed to the first side BS, an electrical connection to an external connection terminal 300 described below is hard.

Figure 8:
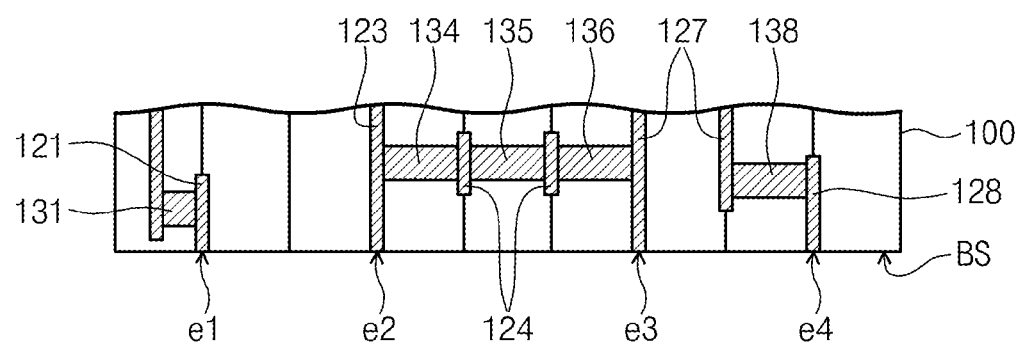

Referring to FIG. 8, a portion of the package body 100 may be removed by a predetermined thickness. All the end parts e1 to e4 may be exposed on the first side BS through the removal process. The removal process may include a grinding process. After the grinding process, a polishing process of the first side BS may be performed.

Figure 9:
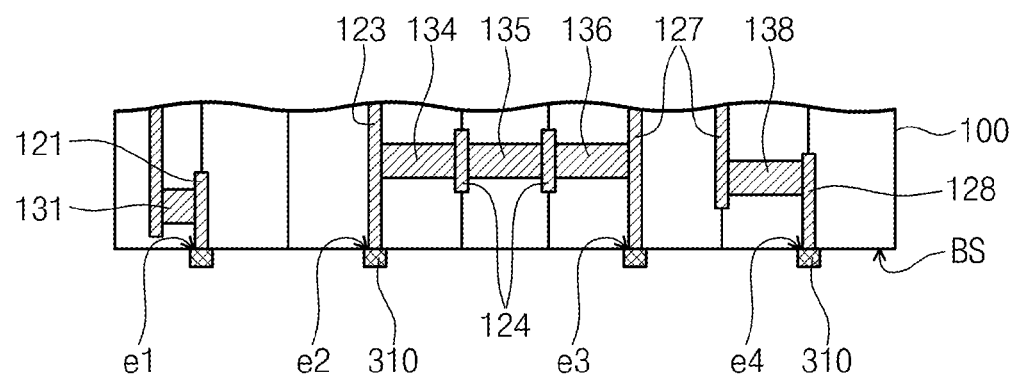
Figure 10:
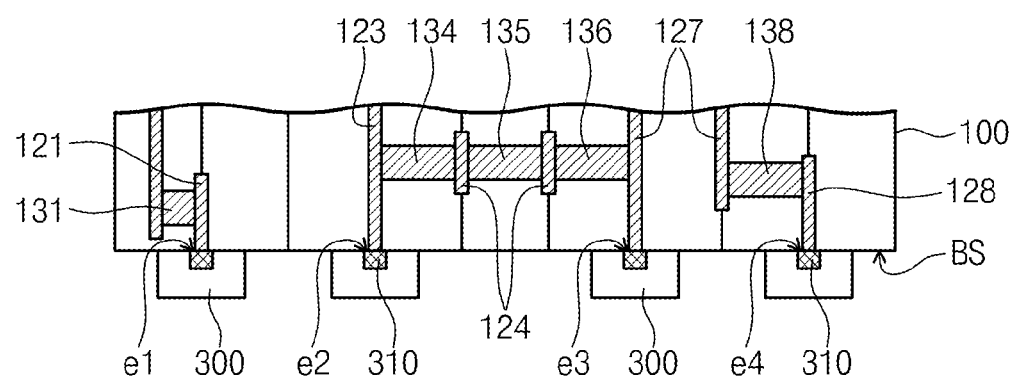

Referring to FIGS. 9 and 10, a connection member 310 may be formed on the end parts e1 to e4. The connection member 310 may be formed by performing electroplating or electroless plating on the end parts e1 to e4. As one example, the connection member 310 may include Al, Cu, Ag, or Au. An external connection terminal 300 may be formed on the connection member 310. The external connection terminal 300 may be electrically connected to the end parts e1 to e4 through the connection member 310. According to a modified embodiment of the present invention, the end parts e1 to e4 and the external connection terminal 300 may be electrically connected to each other more easily through the connection member 310.

Since a plurality of semiconductor chips are mounted through an LTCC technique, a package is realized without wire bonding. In case of different sizes and functions of semiconductor chips, they may be mounted on one package. Since semiconductor chips and sheets are provided vertical to the plane where an external connection terminal is formed, an area of the semiconductor package occupies may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor package, the method comprising:
    forming a plurality of sheets where a conductive pattern and a via are formed;
    attaching semiconductor chips to at least a portion of the sheets;
    forming a package body by stacking the plurality of sheets in a first direction; and
    forming an external connection terminal on a first side of the package body,
    wherein the first side is parallel to the first direction, and
    the semiconductor chips are electrically connected with each other through the conductive pattern and the via, not through the external connection terminal.

2. The method of claim 1, wherein the forming of the sheets comprises forming a chip mounting region for mounting the semiconductor chips on the sheets.

3. The method of claim 2, wherein the forming of the chip mounting region comprises recessing the sheets through laser processing or punching.

4. The method of claim 1, wherein the forming of the package body further comprises forming an adhesive layer between the sheets.

5. The method of claim 4, wherein the forming of the package body further comprises performing a firing process on the sheets before the forming of the adhesive layer.

6. The method of claim 1, further comprising performing a firing process after the stacking of the sheets.

7. The method of claim 1, wherein the first side exposes the conductive patterns and the conductive patterns are electrically connected to the external connection terminal.

8. The method of claim 7, further comprising, before the forming of the external connection terminal, forming a connection member by performing a plating process on the exposed conductive patterns.

9. The method of claim 1, further comprising, before the forming of the external connection terminal, exposing the conductive patterns by performing a grinding process on the first side.

10. The method of claim 1, wherein the via includes a through via which penetrates one of the plurality of sheets from one side to the other side of said one of the plurality of sheets.

11. The method of claim 1, wherein the plurality of sheets includes a first sheet and a second sheet, and one of the semiconductor chips is embedded in an empty space formed by the first sheet, and a buffer member is provided at one side of said one of the semiconductor chips and comes in contact with the second sheet.

12. The method of claim 1, wherein the plurality of sheets includes a first sheet, a second sheet and a third sheet, and one of the semiconductor chips is embedded in an empty space formed by the first sheet disposed between the second and third sheets, and a buffer member is provided to fill a space between said one of the semiconductor chips and the second and third sheets.

* * * * *